(12) United States Patent
Hillenius et al.

(10) Patent No.: US 10,694,620 B1
(45) Date of Patent: Jun. 23, 2020

(54) METHOD AND APPARATUS FOR CIRCUIT BOARD NOISE SHIELDING AND GROUNDING

(71) Applicant: Microsoft Technology Licensing, LLC, Redmond, WA (US)

(72) Inventors: Andrew James Hillenius, Woodinville, WA (US); Jason Allen Harrigan, Sultan, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/373,314

(22) Filed: Apr. 2, 2019

(51) Int. Cl.
H05K 1/02 (2006.01)

(52) U.S. Cl.
CPC ......... *H05K 1/0256* (2013.01); *H05K 1/0215* (2013.01); *H05K 1/0216* (2013.01); *H05K 1/0296* (2013.01)

(58) Field of Classification Search
CPC .. H05K 1/0256; H05K 1/0296; H05K 1/0216; H05K 1/0215
USPC .......................................................... 174/261
See application file for complete search history.

(56) References Cited

U.S. PATENT DOCUMENTS

| 4,774,634 | A | * | 9/1988 | Tate | H05K 1/0263 |
| | | | | | 29/831 |
| 5,043,526 | A | * | 8/1991 | Nakagawa | H05K 1/0218 |
| | | | | | 174/250 |
| 5,165,055 | A | | 11/1992 | Metsler | |
| 5,341,274 | A | * | 8/1994 | Nakatani | H05K 1/0216 |
| | | | | | 174/394 |
| 5,466,893 | A | * | 11/1995 | Nakatani | H05K 1/00 |
| | | | | | 174/250 |
| 6,252,176 | B1 | * | 6/2001 | Kuramochi | H05K 1/024 |
| | | | | | 174/254 |
| 7,889,134 | B2 | | 2/2011 | McKinzi et al. | |
| 9,338,881 | B2 | | 5/2016 | Cases et al. | |
| 9,433,090 | B2 | | 8/2016 | Atkinson et al. | |
| 9,717,140 | B2 | | 7/2017 | Contreras et al. | |
| 9,907,160 | B2 | | 2/2018 | Lin | |
| 9,949,360 | B2 | | 4/2018 | Chen | |
| 2001/0033478 | A1 | * | 10/2001 | Ortiz | H01R 13/6599 |
| | | | | | 361/818 |
| 2012/0228006 | A1 | * | 9/2012 | Chen | H05K 1/0224 |
| | | | | | 174/251 |

(Continued)

FOREIGN PATENT DOCUMENTS

CN 104378908 B 6/2017

*Primary Examiner* — Sherman Ng
(74) *Attorney, Agent, or Firm* — Arent Fox LLP

(57) ABSTRACT

The present disclosure relates to a printed circuit board (PCB) device and methods for fabricating a PCB device. In some aspects, the PCB device can comprise a surface or internal layer including one or more electrically conductive traces configured to carry a signal or power plane. The PCB device can also comprise at least one thin film comprising an electrically insulating material disposed on the surface or the internal layer. Additionally, the PCB device can comprise one or more electrically conductive layers on the at least one thin film. In some aspects, the one or more electrically conductive layers and the one or more electrically conductive traces can be separated by the at least one thin film in a configuration that defines a capacitive frequency response between the one or more electrically conductive layers and the one or more electrically conductive traces.

18 Claims, 6 Drawing Sheets

(56) References Cited

U.S. PATENT DOCUMENTS

2012/0320558 A1* 12/2012 Foster .................. H05K 1/0218
361/818

* cited by examiner

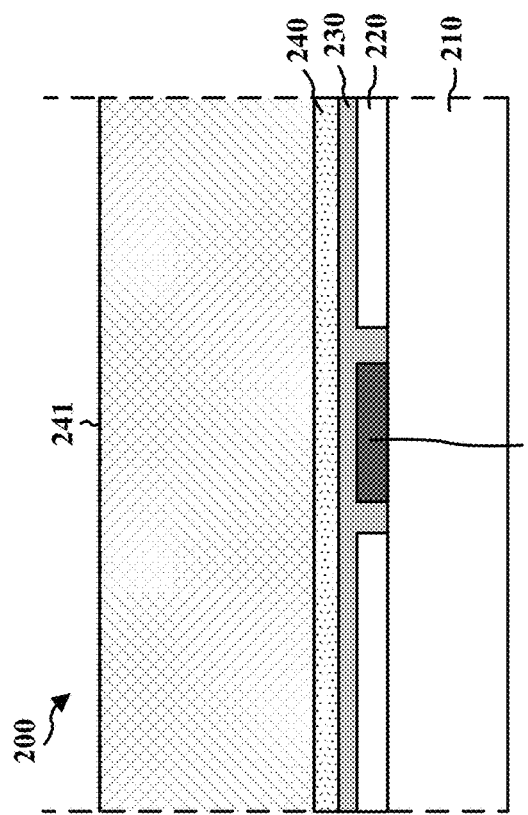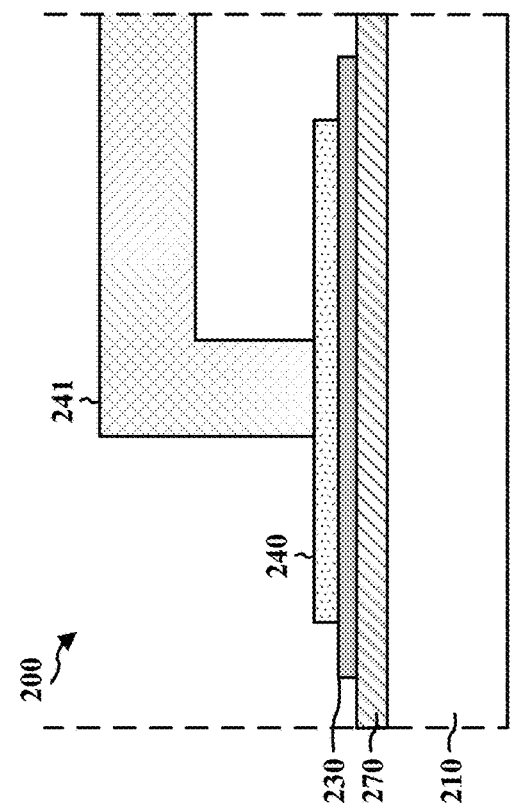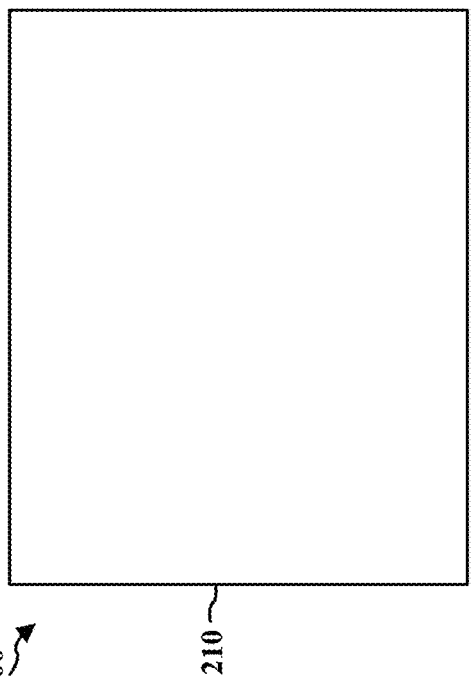

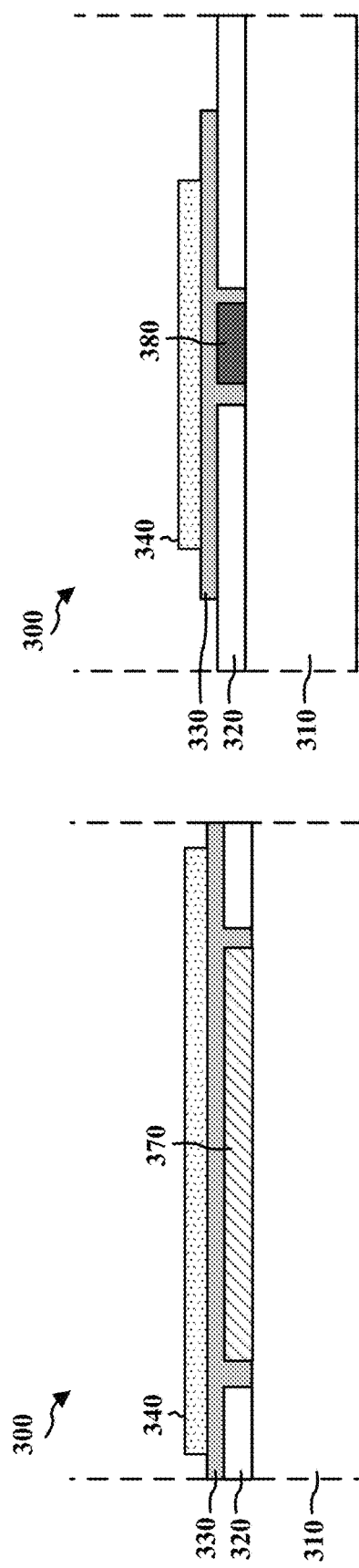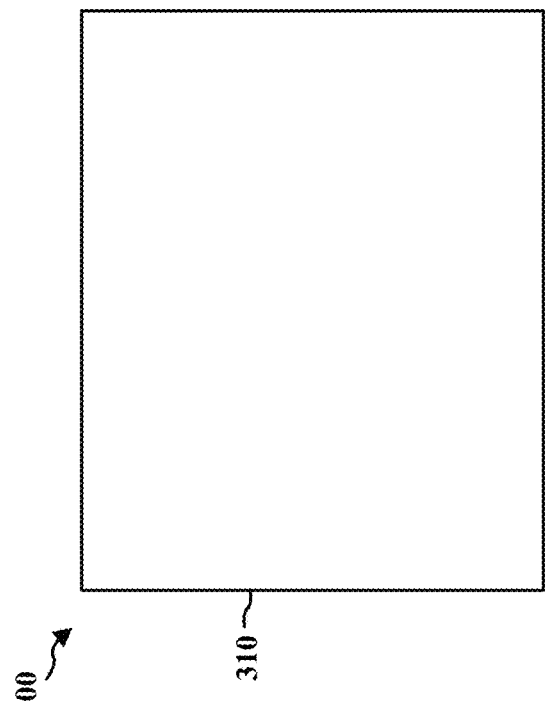

METHOD AND APPARATUS FOR CIRCUIT BOARD NOISE SHIELDING AND GROUNDING

BACKGROUND

The present disclosure relates generally to printed circuit boards (PCBs) and, more particularly, to one or more methods or apparatus for improving noise shielding and grounding on PCBs.

PCBs can connect different electrical components using conductive traces or pads, where the different components can be soldered on to the PCB. PCBs are used in many electronic products, e.g., computers. Many PCBs have little extra space because the boards are crowded with different components. PCBs can have limited space on the board surface for a number of reasons, including the ever increasing demand for reduction in size of the board. In some instances, this reduced amount of space can reduce the available exposed ground areas on the PCB. As a result, it can be difficult to ground components, e.g., a heat sink, to a PCB when there is no or little exposed ground area on the PCB. Additionally, components on the PCB can produce noise during operation. For instance, when the electronics on a PCB are operating, they can produce noise which can affect other neighboring components. For example, noise surrounding certain types of components, e.g., antennas, can cause those components to malfunction.

As a result of the decreased exposed surface area on the PCB and component-produced noise, there has developed a need for improvements in PCB design.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, an apparatus including a PCB device has a thin film layer configured to improve grounding or noise reduction. The apparatus can include a surface or internal layer including one or more electrically conductive traces configured to carry a signal or power plane. The apparatus can also include at least one thin film comprising an electrically insulating material disposed on the surface or the internal layer. Additionally, the apparatus can include one or more electrically conductive layers on the at least one thin film. In some aspects, the one or more electrically conductive layers and the one or more electrically conductive traces can be separated by the at least one thin film in a configuration that defines a capacitive frequency response between the one or more electrically conductive layers and the one or more electrically conductive traces.

In another aspect of the disclosure, a method of making an apparatus including the PCB device includes applying at least one thin film comprising an electrically insulating material on a surface or internal layer. In some aspects, the surface or the internal layer can include one or more electrically conductive traces defining a signal or power plane. The method can also include applying one or more electrically conductive layers on the at least one thin film in a configuration that defines a capacitive frequency response between the one or more electrically conductive layers and the electrically one or more conductive traces. In some aspects, the one or more electrically conductive layers and the one or more electrically conductive traces can be separated by the at least one thin film.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIGS. 2A and 2D are top and bottom side views, respectively, of an example PCB device in accordance with one or more techniques of this disclosure. FIGS. 2B and 2C are cross sectional views of the PCB device shown in FIG. 2A, taken along lines B-B and C-C, respectively.

FIGS. 3A and 3D are top and bottom side views, respectively, of an example PCB device in accordance with one or more techniques of this disclosure. FIGS. 3B and 3C are cross sectional views of the PCB device shown in FIG. 3A, taken along lines B-B and C-C, respectively.

DETAILED DESCRIPTION

Figure 1:
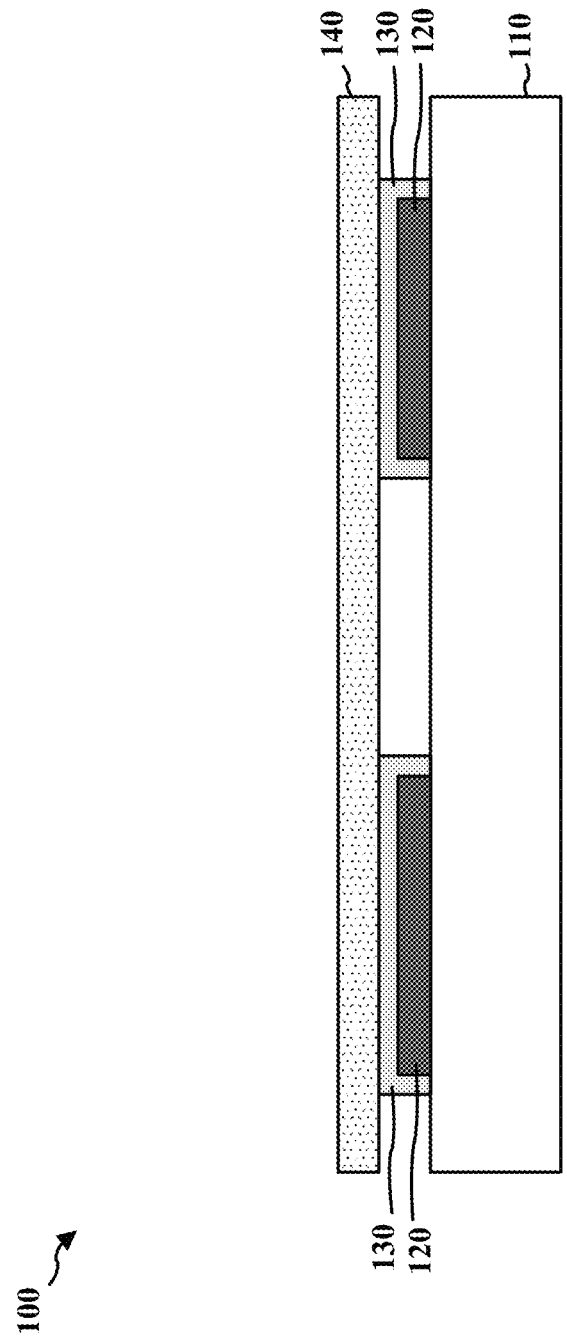
FIG. 1 is a schematic cut-away left side view of an example PCB device in accordance with one or more techniques of this disclosure.

Various aspects of a PCB apparatus and a method of making the PCB apparatus are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of this disclosure to those skilled in the art. Based on the teachings herein one skilled in the art should appreciate that the scope of this disclosure is intended to cover any aspect of the apparatuses and methods disclosed herein, whether implemented independently of, or combined with, other aspects of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. Any aspect disclosed herein may be embodied by one or more elements of a claim.

PCBs are used in many different types of electronic products that utilize electrical circuitry, e.g., computers. PCBs can both support and connect different types of electrical components or circuitry. For instance, PCBs can help to connect different electrical components using conductive traces or pads. In some instances, the different components can be soldered directly on to the PCB. All of the different components on the PCB can take up a lot of surface area, also referred to as board space. Indeed, many PCBs have little extra space on the boards due to crowding from the different components. Further, there seems to be ever increasing desire to reduce the amount of board space on PCBs. For example, some PCBs may be reduced in size in order to correspondingly reduce the space occupied in the electronic product using the PCB.

In some instances, this reduced amount of available space on the PCB has reduced the available exposed ground areas on the PCB. This can happen for a number of reasons, such as the use of a low cost PCB with few layers. Further, some components, signals, or power components, may need to be on the outer layer of the PCB. As a result, it can be difficult to ground components, e.g., a heat sink, to a PCB when there is no or little exposed ground area on the PCB. As mentioned above, exposed ground areas on the PCB can be required for certain components to be able to contact in order to ground the board effectively. For example, desired exposed ground areas can be smaller pads or larger areas, depending on the type of component or material that requires grounding. In some aspects, direct grounding of certain components, e.g., vias or traces, may not be allowed. Additionally, some aspects of grounding material may need to be on a ground plane. Also, it can be difficult and/or expensive to ground common mode noise on certain locations of PCBs, e.g., power planes. Certain aspects of grounding applications, e.g., antenna grounding, may also require low impedance ground connections. Ground and/or grounding mentioned herein may refer to a number of different grounding applications of PCBs, e.g., a common conductor defined as 0 V potential or a low AC impedance sufficient to return a signal or noise current to a common reference conductor. In previous attempts to solve grounding issues, some PCBs may have ground planes throughout the entire motherboard. So typically the board itself may require a ground on the top layer. As mentioned above, in certain types of PCBs, there is not enough room for grounding where it may be required.

Additionally, components on the PCB can produce noise during operation. For instance, when the electronics on a PCB are operating, they can produce noise which can affect other neighboring components. For instance, noise surrounding certain types of components, e.g., radio frequency receivers, can cause the component to malfunction. For example, when certain device electronics are operating, they can produce noise, which can cause the receivers or other components on the device to be affected by the noise. In turn, this can cause the receivers, or the radio frequency signals received by the receivers, to incur interference. In order to solve this noise issue, some systems may utilize discrete noise filters. However, discrete filters increase board space and may be impractical for large busses. Accordingly, there is a need to effectively shield certain components from noise produced by other components.

Aspects of the present disclosure can solve one or more of the aforementioned grounding and noise shielding issues. For instance, aspects of the present disclosure can provide grounding options to PCBs that have limited space for grounding. Additionally, aspects of the present disclosure can provide the ability to shield noise produced by certain components from other components on the PCB. In some aspects, implementations herein can solve the aforementioned grounding and shielding issues by providing a conductive layer or material on the PCB. A thin film can also be included between the conductive layer and the PCB surface. In some aspects, the conductive layer and/or thin film can overlay or be adjacent to conductive traces or vias on the board. In other aspects, the conductive layer and/or thin film can surround or enclose an area on the surface of the board. By doing so, the conductive layer and/or thin film can allow shielding components to close off any gaps and provide a high frequency return path around these areas for any noise produced. The conductive layer and/or thin film can also provide a shunt path to certain components on the PCB, e.g., a heat sink or shield. The conductive layer can be any number of conductive materials, including types of conductive foams.

More specifically, the thin film can be positioned between one or more conductive traces and the conductive layer in a specific configuration to define a target capacitive frequency response designed to achieve a target shielding and/or grounding performance. For instance, by providing a certain capacitive frequency response, aspects of the present disclosure can provide capacitive shunt locations for components, e.g. shield or heat sink, to block or shield certain components from noise, e.g., high frequency noise, produced by other components. In some aspects, blocking or shielding certain components from noise can solve potential desense issues, i.e., a degradation in receiver sensitivity from system generated noise, e.g., an antenna, picking up noise from a serial data bus. In some aspects, blocking or shielding certain components from noise can improve noise shielding, such as but not limited to reductions up to 10 dB in some example implementations. In some aspects, by blocking or shielding certain components, the present disclosure may not require any other mechanical shielding devices, thereby reducing device cost and/or improving manufacturing efficiency. In other aspects, a mechanical shield or heat sink may sit on top of the perimeter of the PCB and provides the shielding. Further, aspects of the present disclosure may result in more efficient and easy to apply shielding, grounding, and/or filtering applications.

In some aspects, the conductive layer and/or thin film can provide a capacitively coupled ground on the PCB. This capacitively coupled PCB ground can provide the required ground path, e.g., even if other wires or signals are present on the surface of the PCB. In some implementations, a solder mask can be placed on all or part of the PCB and removed or replaced with the thin film or conductive layer. The thin film can allow certain materials, e.g., electromagnetic interference (EMI) mitigation materials to sit directly on top of the surface of the PCB. For example, the thin film can allow signals and/or power planes to sit directly on the PCB surface, as well as be capacitively coupled to other components. In turn, this can allow capacitive shunting to the top of the PCB surface.

Referring to FIG. 1, an example PCB device 100 includes a PCB layer 110 including one or more electrically conductive traces 120 configured to carry a signal or power plane. As shown in FIG. 1, PCB device 100 can also include a thin film 130 comprising an electrically insulating material disposed on the PCB layer 110, for example, covering all or part of the one or more electrically conductive traces 120. Additionally, PCB device 100 can include an electrically conductive layer 140 on the thin film 130. Electrically conductive layer 140 can include one or more layers, so it can also be referred to as electrically conductive layers. As further shown in FIG. 1, the electrically conductive layer 140 and the one or more electrically conductive traces 120 can be separated by the thin film 130. Accordingly, the electrically conductive layer 140 and the one or more electrically conductive traces 120 can be spaced apart from one another, by the thin film 130, in a configuration of layers 120/130/140 that defines a capacitive frequency response, e.g., between the electrically conductive layer 140 and the one or more electrically conductive traces 120. The capacitive frequency response can be defined to provide a certain shielding, grounding, and/or signal filtering performance.

In some aspects, PCB layer 110 may be referred to as surface or internal layer 110. As shown in FIG. 1, the one or more electrically conductive traces 120 can be directly on top of the surface of the PCB layer 110. Additionally, thin film 130 can be on the PCB layer 110. In some aspects, thin film 130 can be between the electrically conductive layer 140 and the PCB layer 110. Further, portions of the electrically conductive layer 140 can be on the PCB layer 110. However, as shown in FIG. 1, other layers, e.g., thin film 130 and/or electrically conductive traces 120, can be between the electrically conductive layers 140 and the PCB layer 110. Further, electrically conductive layer 140 may directly contact PCB layer 110 in some areas where an electrically conductive trace 120 is not present. FIG. 1 also includes a gap between the electrically conductive layers 140 and the PCB layer 110, however, a number of other layers may be fill this gap or be between the electrically conductive layer 140 and the PCB layer 110, e.g., electrically conductive traces 120, thin film 130, or a thicker section of the electrically conductive layers 140. The PCB layer 110 can also comprise a number of different materials, such as a dielectric or epoxy material. Accordingly, PCB layer 110 can also be referred to as dielectric layer, epoxy layer, or any appropriate term.

The one or more electrically conductive traces 120 can also be referred to as vias 120 or traces 120. Additionally, the electrically conductive traces 120 can be configured to carry a number of different signals or a power plane. As mentioned above, the one or more electrically conductive traces 120 can be directly on top of the surface of the PCB layer 110. The electrically conductive traces 120 can also be on the side of the PCB layer 110 or the bottom of PCB layer 110. In some instances, the electrically conductive traces 120 can be inside of, or internal to, the PCB layer 110 (e.g., the PCB 100 may have multiple layers of PCB, traces, thin film, and electrically conductive materials). The electrically conductive traces 120 can also be between the PCB layer 110 and the thin film 130 and/or conductive layers 140. The electrically conductive traces 120 can comprise any number of different materials, such as a metallic material, e.g., copper or any appropriate metallic material. For example, electrically conductive traces 120 can be a copper foil including an example resistivity of 0.5 mOhms-m, a conductive foam including an example resistivity of 0.3 Ohms-m, and/or a carbon ink including an example resistivity of 20 Ohms-m.

As mentioned above, the one or more electrically conductive traces 120 and the one or more electrically conductive layers 140 can be separated by the at least one thin film 130. This configuration of layers 120/130/140 can define a capacitive frequency response between the one or more electrically conductive traces 120 and the one or more electrically conductive layers 140. This capacitive frequency response can be configured to shield, ground, or filter noise or unwanted signals carried on the one or more electrically conductive traces 120. The capacitive frequency response can also be adjustable based on at least one of a thickness of the thin film 130 or a pattern of the one or more electrically conductive layers 140. Additionally, the one or more electrically conductive layers 140 and the thin film 130 can have a first shape or pattern that surrounds or encloses an area on the PCB layer 110 that includes at least a portion of the one or more electrically conductive layers 140. The one or more electrically conductive layers 140 and the thin film 130 can also have a first shape or pattern that overlies or matches at least a portion of a second shape or pattern of the one or more electrically conductive traces 120.

As shown in FIG. 1, the thin film 130 can be between the electrically conductive traces 120 and the electrically conductive layers 140. Also, the thin film 130 can be between the PCB layer 110 and the electrically conductive layers 140, e.g., on portions of the board without an electrically conductive trace 120. The thin film 130 can comprise any number of appropriate materials, such as a dielectric material or an insulating material. Accordingly, the thin film 130 can be a dielectric or an insulator. In some aspects, the thin film 130 can comprise an adhesive layer and/or a metallic layer. The thin film 130 can also comprise an elastomer, epoxy, and/or glass. For instance, thin film 130 can be an epoxy including an example resistivity of $1\times10^{12}$ Ohms-m and/or glass including an example resistivity of $1\times10^{15}$ Ohms-m. Typically, insulator resistivity can be many orders of magnitude higher than conductor resistivity. In some aspects, the thin film 130 can insulate and protect the surface of the PCB layer 110, e.g., from shorting. For example, the thin film 130 can be substantially more insulating than the electrically conductive traces 120 and/or the electrically conductive layers 140. The thin film 130 can also comprise oxides or various coatings, e.g., organic or non-organic coatings. For example, the thin film may include a number of special coatings and treatments for the PCB device 100, such as are designed to form films while still maintaining robust electrical insulation. These coatings for the thin film 130 can be oxides, organic varnishes, or any number of similar coatings.

The thin film 130 can also be a variety of different thicknesses. Indeed, the phrase 'thin film' does not necessarily refer to a measurement of thickness. In some instances, the thickness of the thin film 130 can be determined by the corresponding contact area on the PCB layer 110 or board, as well as the capacitance desired for a certain application. In some aspects, the thickness of the thin film 130 can be based on a geometry or thickness of the one or more electrically conductive traces 120. For example, in order to maintain a desired capacitive frequency response, when the width of the conductive traces 120 increases, the thickness of the thin film 130 can correspondingly increase. As shown in FIG. 1, the thin film 130 can be on the top of PCB layer 110, as well as on the bottom of PCB layer 110. Additionally, aspects of the present disclosure can include a PCB structure that includes thin film 130 inside of the PCB layer 110. Accordingly, the thin film 130 can be within the PCB device 100, in addition to on the outside of the PCB device 100. Aspects of the present disclosure can also place the thin film 130 in additional locations on the PCB device 100, as long as there is sufficient planar area for contacting or grounding applications.

Further, PCB devices 100 herein can include the thin film 130 with varying thicknesses, i.e., such as a transition layer or multiple transition layers. The thickness of the thin film 130 can also be dependent on the type of conductive traces 120. For instance, when desired signals on conductive traces 120 correspond to higher frequency, aspects of the present disclosure may not require as much filtering, so as to allow the desired signals to pass through. For example, some conductive traces 120 may be higher or more tightly coupled than other traces. As indicated above, aspects of the present disclosure can control the frequency response by changing the thickness of the thin film 130 or the thickness of the conductive traces 120, as well as the pattern of the conductive layers 140. Further, aspects of the present disclosure can adjust the thickness of the thin film 130 to corresponding locations on the PCB layer 110, such as to be thicker in certain areas of the board.

As indicated above, the thin film 130 can also be an adhesive layer or a pressure-sensitive adhesive. For example, thin film 130 can hold certain layers, e.g., conductive traces 120 or conductive layers 140 onto the PCB layer 110 or board. This can be a low cost manner of increasing the effectiveness of the thin film 130. Accordingly, thin film 130 can also be referred to as an adhesive layer. The thin film 130 may also be connected or in between a circuit and the conductive layers 140. Moreover, in some aspects, the thin film 130 may not make electrical contact with any other components on the PCB device 100.

As shown in FIG. 1, the electrically conductive layers 140 can be on top of the thin film 130 and the electrically conductive traces 120. In some aspects, the electrically conductive layers 140 can be directly contacting the thin film 130. In some cases or in some areas where the capacitive frequency response is not needed, the electrically conductive layers 140 can also be directly contacting the electrically conductive traces 120. And in some aspects, the electrically conductive layers 140 can be directly contacting the PCB layer 110. The electrically conductive layers 140 can comprise any number of electrical or conductive materials, e.g., metallic materials or any similar layer. In some aspects, the electrically conductive layers 140 can be a metallic foil. Also, electrically conductive layers 140 can be a copper foil including an example resistivity of 0.5 mOhms-m, a conductive foam including an example resistivity of 0.3 Ohms-m, and/or a carbon ink including an example resistivity of 20 Ohms-m. Further, in some instances, the electrically conductive layers 140 can be referred to as a conductor.

In some aspects, the electrically conductive layers 140 can provide a protective function. For instance, as the electrically conductive layers 140 are on the top of the PCB device 100, they can protect one or more additional layers in the PCB device 100. For example, the electrically conductive layers 140 can mechanically protect the thin film 130, the conductive traces 120, and/or the PCB layer 110. The electrically conductive layers 140 can also be deposited on the thin film 130, the conductive traces 120, and/or the PCB layer 110. In some aspects, the electrically conductive layers 140 or the thin film 130 can be deposited on the surface of the PCB layer 110 using a vacuum deposition process.

As indicated herein, aspects of the present disclosure can treat the surface of the PCB layer 110 with a dielectric or insulating material, e.g., thin film 130, such that conductive layers 140 can be placed on top of the PCB layer 110 and form a high frequency ground. In some instances, this high frequency ground can be provided to any signal traces, e.g., conductive traces 120, power planes, or ground planes that are on PCB layer 110. By doing so, implementations herein can provide ground connections directly over the PCB device 100, which can in turn solve the aforementioned grounding issues.

Additionally, aspects of the present disclosure can produce a capacitor or capacitive frequency response, such as with the configuration of the conductive traces 120, thin film 130, or conductive layers 140. For instance, two conductors, e.g., conductive traces 120 and conductive layers 140, that are separated by an insulator, e.g., thin film 130, have a capacitance. In some aspects, the capacitance from the formation of the traces 120, thin film 130, and conductive layers 140 may provide a low impedance connection. Also, spacing apart the conductive layers 140 from the electrically conductive traces 120 can result in a capacitance or capacitive frequency response between the two layers. In some aspects, the capacitance or capacitive frequency response can be based on the distance between the conductive layers 140 and the electrically conductive traces 120. Accordingly, aspects of the present disclosure can creating a capacitive frequency response through spacing between the conductive layers 140 and the electrically conductive traces 120 and providing the thin film 130 between the two layers. In some aspects, the conductive layers 140 and the electrically conductive traces 120 may not contact each other.

As indicated herein, aspects of the present disclosure can shield or protect certain components from noise produced by other components on the board. For instance, aspects of the present disclosure can be designed to keep noise from penetrating a perimeter. In order to do so, aspects of the present disclosure can form a ground to each conductive trace 120 that surrounds a certain area. For example, the conductive layers 140 and/or the thin film 130 can form a perimeter around a certain area on PCB layer 110. By contacting the conductive traces 120 around this designated area, the conductive layers 140 and/or the thin film 130 can provide a ground perimeter to ground a component, e.g., a shield, heat sink, chassis, or metallic component, which can be used to shield or isolate noise produced in this area. In some aspects, the surface of the PCB layer 110 may have a thick dielectric coating, which may require a corresponding large area of conductive material to be used, e.g., in order to provide sufficient shielding capabilities.

In some aspects, the noise source may be a system-on-chip (SoC) or a memory on the PCB device 100. In these instances, implementations herein can isolate or shield the noise or noisy signals around the memory and the SoC from getting outside of a certain area. In order to do so, aspects of the present disclosure can form a perimeter around the desired area, e.g., the memory and the SoC, with the conductive layers 140 and/or the thin film 130. The conductive layers 140 and/or the thin film 130 may also contact or form a ground to the conductive traces around this area. In some aspects, there may be openings in the conductive layers 140, which can experience some noise leakage. Aspects of the present disclosure may utilize another component, e.g., a shield, heat sink, chassis, or metallic component, to shield this noise leakage in the structure of the conductive layers 140. As mentioned above, these noise isolating or shielding formations can reduce the amount of noise power radiated from a design, e.g., in some examples a 10 dB reduction. By blocking or shielding certain components, aspects of the present disclosure may not require any other mechanical shielding devices.

Aspects of the present disclosure can also provide grounding to portions of the PCB device 100 that would not otherwise be capable of grounding. For instance, the conductive layers 140 and/or the thin film 130 can overlay a portion of the conductive traces 120, such that the conductive layers 140 and/or the thin film 130 can provide the grounding in these overlaying areas. By doing so, the conductive layers 140 and/or the thin film 130 can essentially act as a shunting capacitor. For example, the conductive layers 140 and/or the thin film 130 can shield or shunt noise from a power plane, i.e., as if using a shunting capacitor. Further, these grounding shunt capacitor formations of the conductive layers 140 and/or the thin film 130 can be useful with small or high-impedance conductive traces 120. Indeed, these formations of the conductive layers 140 and/or the thin film 130 that overlay the conductive traces 120 can act similar to a grounding capacitor with very low impedance, which can successfully shunt power off a power plane on the PCB layer 110.

In some aspects, the size of the grounding formation of the conductive layers 140 and/or the thin film 130 can correspond to the size of the conductive trace 120. Accordingly, the size of the conductive trace 120 from which implementations are attempting to shunt noise from can correspond to the size of the conductive layers 140 and/or the thin film 130 formation, i.e., the grounding strap. In some aspects, the size of the conductive layers 140 and/or the thin film 130 formation can correspond to the boundary between the formation and a power plane. Further, the size of the conductive layers 140 and/or the thin film 130 formation can correspond to the distance of the ground on each side of the formation or strap. As such, the size of the grounding formation can be dependent on geometry and frequency.

In some aspects, the grounding formation, e.g., the conductive layers 140 and/or the thin film 130 formation, may be on one portion of the conductive traces 120. In these aspects, the grounding formation may only cut across one part of the trace 120. Accordingly, aspects of the present disclosure can include a grounding strap or portion along a portion of the trace 120. For example, the grounding formation, e.g., the conductive layers 140 and/or the thin film 130 formation, can be along the edge of, or slightly overlap, a conductive trace 120. Additionally, the grounding formation, e.g., the conductive layers 140 and/or the thin film 130 formation, can completely cover a portion of the conductive trace 120.

In some aspects, the aforementioned grounding application can be a way to ground or filter the power supply of high frequency noise in the PCB device 100. In addition, the grounding application can provide high frequency return currents over a power supply trace, e.g., conductive trace 120. Accordingly, the grounding formation of the conductive layers 140 and/or the thin film 130 can be referred to as a filtering formation. Moreover, the grounding formation, e.g., the conductive layers 140 and/or the thin film 130 formation, can provide a path for high frequency currents on a ground plane to cross a power supply trace, e.g., conductive trace 120. In some aspects, there can be a cutoff frequency that limits the effectiveness of the grounding formation.

As indicated above, aspects of the present disclosure can perform both shielding and/or grounding applications for PCB device 100. In some aspects, the shielding application can be applied to portions of the PCB device 100 that include noisy components, e.g., SoC and memory. Accordingly, the shielding application may not be applied to portions of the PCB device 100 that do not experience much noise. The grounding application can be applied throughout the board. In some aspects, the grounding application may be applied in the locations where the power plane is exposed. Additionally, for each of the shielding and grounding applications, the size or area of the conductive layers 140 and/or the thin film 130 may be based on the corresponding application or the amount of coupling required. For example, the size or area of the conductive layers 140 and/or the thin film 130 may depend on the amount of shielding or capacitance required, as well as the quality of the thin film 130. In some aspects, e.g., in the shielding application, the conductive traces 120 can be capacitively coupled to the board ground. For instance, aspects of the present disclosure can essentially construct a conductive surface that can be connect to other parts of the PCB device 100. In other aspects, e.g., in the grounding application, aspects of the present disclosure may not need to connect to other parts of the PCB device 100 or a connective ground.

Aspects of the present disclosure can include the shielding application on PCB device 100, the grounding application on PCB device 100, or a combination of both the shielding application and the grounding application on PCB device 100. In some instances, by controlling the geometry or the thickness of the conductive layers 140 and/or the thin film 130, then aspects of the present disclosure can control the shielding application and/or the grounding application. Controlling the geometry or the thickness of the conductive layers 140 and/or the thin film 130 can also solve potential desense issues in PCB device 100. As mentioned above, blocking or shielding certain components, e.g., with the conductive layers 140 and/or the thin film 130 formation, can solve self-generated noise or desense issues. Additionally, blocking or shielding certain components, e.g., with the conductive layers 140 and/or the thin film 130 formation, can solve EMI issues, such as EMI mitigation.

As indicated above, the shielding and grounding applications, e.g., the conductive layers 140 and/or the thin film 130 formation, can be on the surface of PCB device 100, e.g., PCB layer 110, as well as on an internal layer or side of the PCB device 100. For example, PCB layer 110 can be an internal layer, so it can also be referred to as surface or internal layer 110. As such, the shielding and grounding applications can be inside or within the PCB device 100, on the surface of the PCB device 100, or on the side of the PCB device 100. In some aspects, grounding and filtering applications, e.g., the conductive layers 140 and/or the thin film 130 formation, may be on interior layers of the PCB device 100 that are not accessible from the top or bottom of the device.

In some aspects, the conductive layers 140 and/or the thin film 130 formation can provide capacitance and/or inductance. For example, the conductive layers 140 and/or the thin film 130 may be on top of the one or more conductive traces 120, and then the traces 120 can provide an inductance. As such, the frequency response resulting from the formation of the conductive layers 140, thin film 130, and conductive traces 120 can be a capacitive frequency response or an inductive frequency response. For example, the frequency response can be defined in certain areas of the PCB device 100 based on a dielectric thickness or insulation, e.g., thickness of the thin film 130. Additionally, the frequency response can be the same or different for the different applications, e.g., shielding or grounding applications.

In further aspects, implementations herein can include a solder mask, e.g., over the areas of PCB device 100 that may need protection. In some instances, a solder mask can be placed over the additional layers, e.g., the conductive layers 140, the thin film 130, the conductive traces 120, and/or the PCB layer 110. Additionally, the thickness of the solder mask can be controlled. For example, the thickness of the solder mask can correspond to the capacitance or the inductance of the corresponding area in PCB device 100. In some aspects, the conductive layers 140 and/or the thin film 130 can be deposited on the surface of the PCB device 100, and the solder mask be deposited over these layers on the PCB device 100.

Figure 2A:
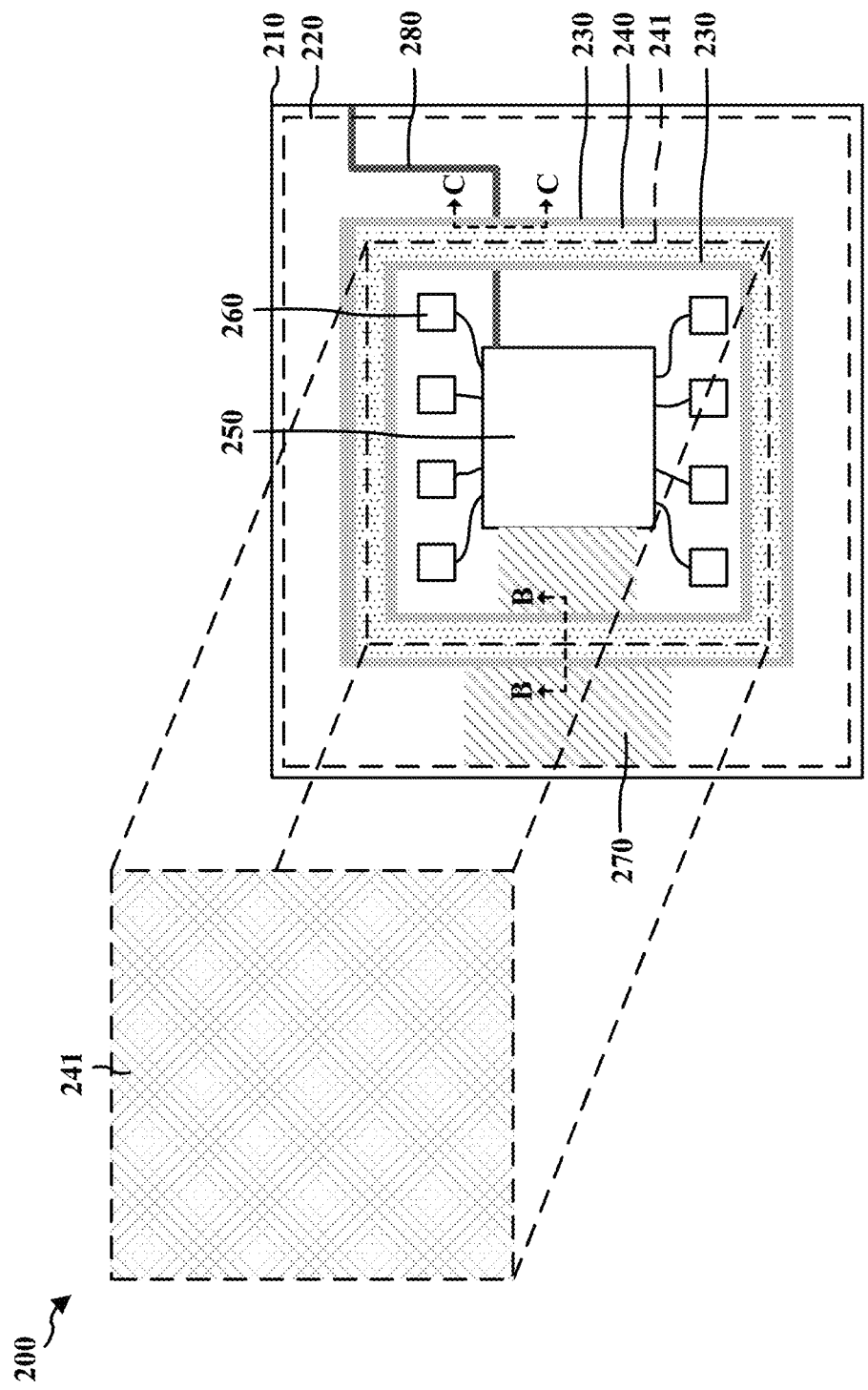

Referring to FIGS. 2A-2D, an example PCB device 200 configured for a shielding application includes a PCB layer 210 including one or more electrically conductive traces 280 configured to carry a signal or power plane. Additionally, PCB device 200 can include ground plane 220, which can also be referred to as ground layer or traces 220. In some aspects, ground plane 220 can cover PCB layer 210 where there are no other traces or planes. Accordingly, in some aspects, the surface of PCB layer 210 can be ground plane 220. PCB device 200 can also include a thin film 230 comprising an electrically insulating material disposed on the PCB layer 210. PCB device 200 can include electrically conductive layers 240 on the thin film 230. As further shown in FIGS. 2A-2D, the electrically conductive layers 240 and the one or more electrically conductive traces 280 can be separated by the thin film 230. Therefore, the electrically conductive layers 240 and the one or more electrically conductive traces 280 can be spaced apart from one another, e.g., with the thin film 230. As shown in FIGS. 2A-2C, in some aspects, the thin film 230 can be located below the electrically conductive layers 240 throughout the PCB device 200. In other aspects, the thin film 230 can be located below the electrically conductive layers 240 where the traces 280 are covered by the electrically conductive layers 240. In some aspects, this configuration of traces 280, thin film 230, and layers 240 can define a capacitive frequency response, e.g., between the electrically conductive layers 240 and the one or more electrically conductive traces 280.

FIGS. 2A-2D include one example of the aforementioned shielding application of the present disclosure. For example, electrically conductive layers 240 and thin film 230 can form a boundary or perimeter around a SoC 250. As indicated above, the SoC 250 can be a relatively noisy component in PCB device 200. PCB device 200 can also include shield or shielding component 241 that can be connected to, and/or provide ground to, electrically conductive layers 240 or thin film 230. Shield or shielding component 241 can be referred to as shield can, shield cover, heat sink, chassis, and/or metallic component. Shield or shielding component 241 can also be used to contain noise from SoC 250 and memory 260 by acting as an electromagnetic barrier that is connected to thin film 230 and/or electrically conductive layers 240 such that the thin film capacitance can be used to shunt noise energy in places where shield or shielding component 241 is not otherwise connected to a PCB ground, e.g., to shield or block the SoC 250 noise from other components in the PCB device 200. In some aspects, the shield or shielding component 241 may be a foil, planar structure, or other conductive layer. FIGS. 2A-2D also include components 260, which can be a number of different circuitry components on the PCB device 200, e.g., memory chips 260 connected to SoC 250. PCB device 200 can also include power plane 270, which can provide or deliver power to SoC 250. The formation of electrically conductive layers 240 and thin film 230 also contact and are deposited on the electrically conductive traces 280. By doing so, the formation can help to shield the noise emanated from SoC 250. As shown in FIGS. 2B and 2C, thin film 230 can be below the conductive layers 240, e.g., between the conductive traces 280 and the conductive layers 240.

As shown in FIGS. 2A-2D, the formation of electrically conductive layers 240 and thin film 230 can shield or protect certain components from noise produced by other components on the board, e.g., SoC 250. For instance, the formation of electrically conductive layers 240 and thin film 230 can be designed to keep noise from penetrating the perimeter of the formation. In order to do so, the formation of electrically conductive layers 240 and thin film 230 can surround a certain area. For example, the conductive layers 240 and thin film 230 can form a perimeter around SoC 250, effectively forming an electro-magnetic interference (EMI) resistant wall around the SoC 250, where the wall may be capped off by another electrically conductive component, e.g., shield or shielding component 241, to form an EMI shield around the SoC 250. Additionally, by forming the conductive traces 280 around this designated area, the conductive layers 240 and/or the thin film 230 can shield or isolate noise produced in this area, e.g., by SoC 250. In some instances, the surface of the PCB layer 210 may have a thick dielectric coating, which may require a corresponding thick amount of conductive material in order to provide sufficient shielding capabilities. In some aspects, electrically conductive layers 240 can be grounded to electrically conductive traces 220 through the thin film 230. Also, electrically conductive layers 240 can include a number of materials, such as a copper foil, a conductive foam, an elastomer, a conductive adhesive, or the like.

In addition to SoC 250, the noise source may be a memory (not shown) on the PCB device 200. Accordingly, implementations herein can isolate or shield the noise or noisy signals around the memory and the SoC 250 from getting outside of a certain area. As indicated above, the conductive layers 240 and/or the thin film 230 may also contact or form a ground to the conductive traces 280 around the SoC 250. As mentioned above, these noise isolating or shielding formations of shield or shielding component 241 in conjunction with conductive layers 240 and/or the thin film 230 can reduce the amount of noise power in a certain area, e.g., a 10 dB reduction.

Referring to FIGS. 3A-3D, an example PCB device 300 configured for an electrical grounding and/or signal filtering application includes a PCB layer 310 including one or more electrically conductive traces 380 configured to carry a signal or power plane. Also, PCB device 300 can include ground plane 320, which can also be referred to as ground layer or traces 320. In some aspects, ground plane 320 can cover PCB layer 310 where there are no other traces or planes. As such, in some aspects, the surface of PCB layer 310 can be ground plane 320. Also, PCB device 300 can include a thin film 330 comprising an electrically insulating material disposed on the PCB layer 310. Additionally, PCB device 300 can include electrically conductive layers 340 on the thin film 330. As further shown in FIGS. 3A-3D, the electrically conductive layers 340 and the one or more electrically conductive traces 380 can be separated, or spaced apart from one another, by the thin film 330. In some aspects, this configuration of traces 380, thin film 330, and layers 340 can define a capacitive frequency response, e.g., between the electrically conductive layers 340 and the one or more electrically conductive traces 380.

Figure 3A:
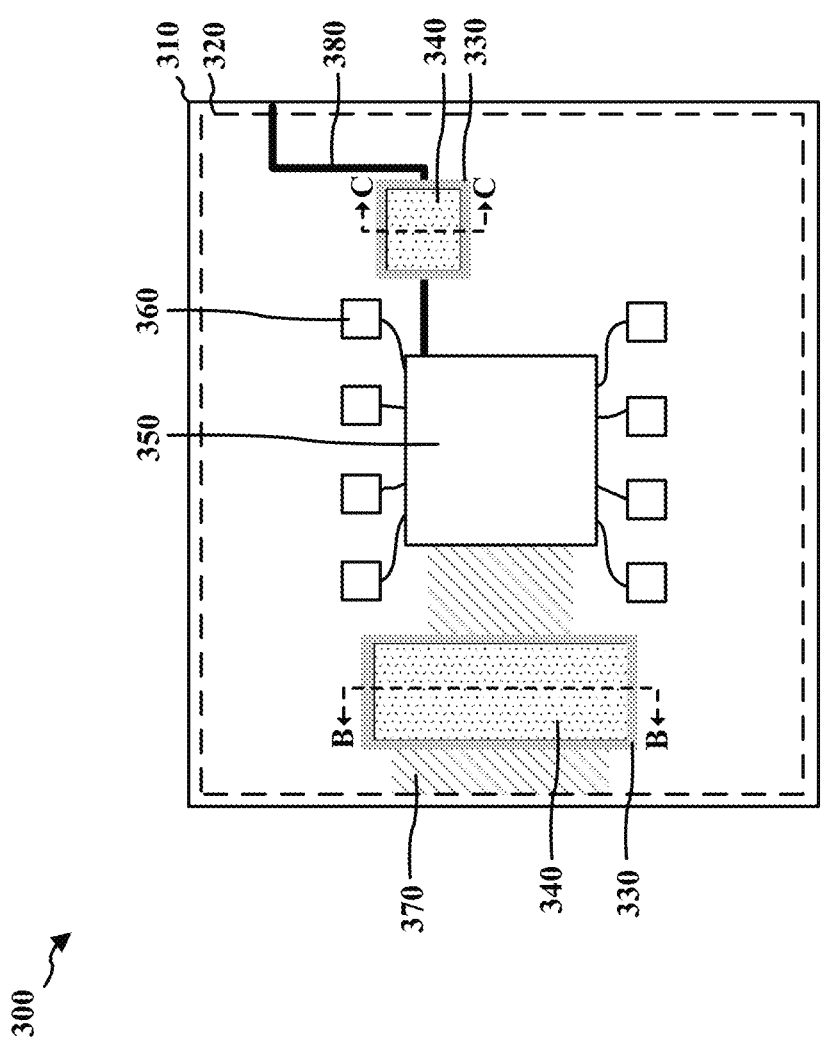

FIGS. 3A-3D include one example of the aforementioned grounding and/or signal filtering application of the present disclosure. For example, electrically conductive layers 340 and/or thin film 330 can overlay or contact at least a portion of the electrically conductive traces 380. FIG. 3A displays that the electrically conductive layers 340 and/or thin film 330 overlay or contact the entire length of electrically conductive traces 380. However, in some instances, electrically conductive layers 340 and/or thin film 330 may only overlay or contact a portion of the electrically conductive traces 380. FIGS. 3A-3D also display SoC 350 and components 360, which can be a number of different circuitry components on the PCB device 300, e.g., memory chips 360 connected to SoC 350. PCB device 300 can also include power plane 370, which can provide or deliver power to SoC 350. In some aspects, the electrically conductive layers 340 can act as a noise shunt for the power plane 370. In other aspects, electrically conductive layers 340 can act as a filter for the electrically conductive traces 380.

The formation of the electrically conductive layers 340 and/or thin film 330 can provide grounding to portions of the PCB device 300 that would not otherwise be capable of grounding by providing an additional surface area on the PCB device 300 for electrically grounding a component. For example, the conductive layers 340 and/or the thin film 330 can overlay a portion of the conductive traces 380, such that the conductive layers 340 and/or the thin film 330 can provide the grounding in these overlaying areas. In turn, the conductive layers 340 and/or the thin film 330 can act as a shunting capacitor in these areas. For instance, the conductive layers 340 and/or the thin film 330 can shield or shunt noise from a power plane, i.e., as if using a shunting capacitor. Moreover, these grounding shunt capacitor formations of the conductive layers 340 and/or the thin film 330 can be useful with certain types of conductive traces 380, e.g., small or high-impedance conductive traces. These formations of the conductive layers 340 and/or the thin film 330 that overlay the conductive traces 380 can act similar to a grounding capacitor with very low impedance, which can shunt noise energy off a power plane on the PCB layer 310.

Additionally, in some cases, the size of the grounding formation of the conductive layers 340 and/or the thin film 330 can correspond to the size of the conductive trace 380. As such, the size of the conductive trace 380 can correspond to the size of the conductive layers 340 and/or the thin film 330 formation, i.e., the grounding strap. In some aspects, the size of the conductive layers 340 and/or the thin film 330 formation can correspond to the boundary between the formation and a power plane. Also, the size of the conductive layers 340 and/or the thin film 330 formation can correspond to the distance of the ground on each side of the formation or grounding strap. Accordingly, the size of the grounding formation can be dependent on geometry and frequency.

As mentioned above, the grounding formation, e.g., the conductive layers 340 and/or the thin film 330 formation, may be on one portion of the conductive traces 380. In these aspects, the grounding formation may cut across one part of the trace 380. Thus, aspects of the present disclosure can include a grounding strap or portion along a portion of the trace 380. For instance, the grounding formation, e.g., the conductive layers 340 and/or the thin film 330 formation, can be along the edge of, or slightly overlap, a conductive trace 380. Moreover, in some aspects, the grounding formation, e.g., the conductive layers 340 and/or the thin film 330 formation, can completely cover a portion of the conductive trace 380.

As indicated herein, the aforementioned grounding application can be a way to ground or filter the power supply of high frequency noise in the PCB device 300. Additionally, the grounding application, e.g., the conductive layers 340 and/or the thin film 330 formation, can provide high frequency return currents over a power supply trace, e.g., conductive traces 380. As such, the grounding formation of the conductive layers 340 and/or the thin film 330 can be referred to as a filtering formation. Further, the grounding formation, e.g., the conductive layers 340 and/or the thin film 330 formation, can provide a path for high frequency currents on a ground plane to cross a power supply trace, e.g., conductive trace 380. As mentioned above, there can be a cutoff frequency that limits the effectiveness of the grounding formation.

Figure 4:
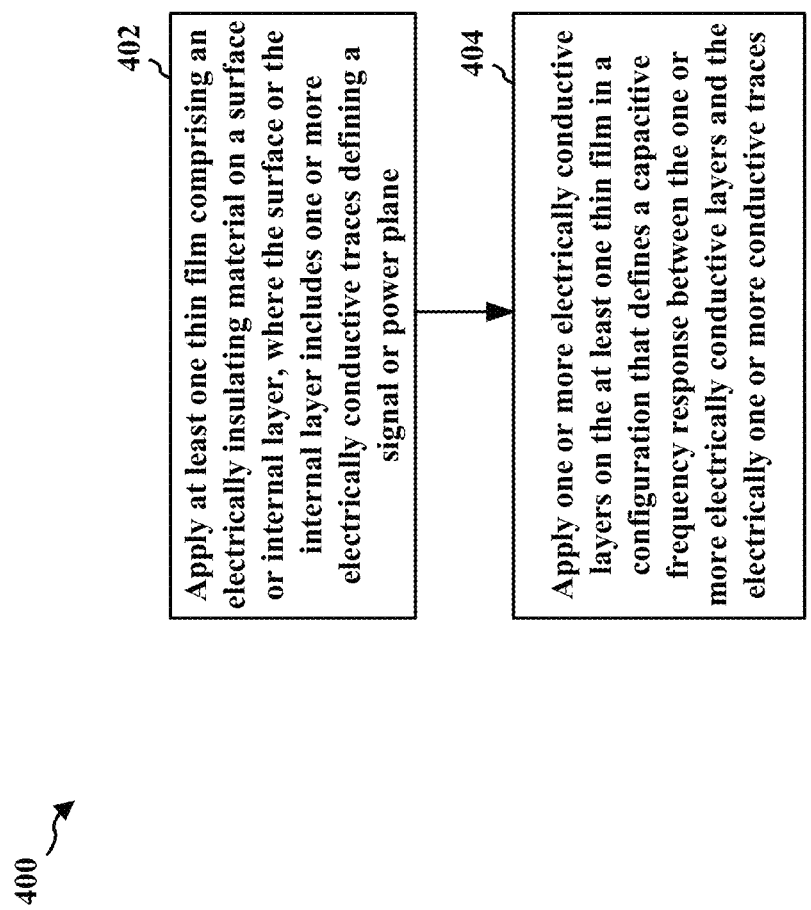
FIG. 4 is a flowchart of an example method in accordance with one or more techniques of this disclosure.

Referring to FIG. 4, an example method 400 in accordance with one or more techniques of this disclosure may be performed to make the PCB devices described herein, e.g., PCB device 100, PCB device 200, or PCB device 300. For example, in some cases, the method 400 of making a PCB device as described herein may be performed by one or more PCB fabrication devices and/or surface mount technology devices.

At 402, the method 400 may include applying at least one thin film comprising an electrically insulating material on a surface or internal layer, as described in connection with the examples in FIGS. 1, 2A-2D, and 3A-3D. In some aspects, the surface or the internal layer can include one or more electrically conductive traces that define a signal or power plane, as described in connection with the examples in FIGS. 1, 2A-2D, and 3A-3D.

At 404, the method 400 may include applying one or more electrically conductive layers on the at least one thin film in a configuration that defines a capacitive frequency response between the one or more electrically conductive layers and the electrically one or more conductive traces, as described in connection with the examples in FIGS. 1, 2A-2D, and 3A-3D. In some aspects, the one or more electrically conductive layers and the one or more electrically conductive traces can be separated by the at least one thin film, as described in connection with the examples in any of FIGS. 1, 2A-2D, and 3A-3D.

In some instances, applying the at least one thin film can comprise applying a thickness of the at least one thin film or a pattern of the one or more electrically conductive layers configured to achieve one of a plurality of values of the capacitive frequency response, as described in connection with the examples in FIGS. 1, 2A-2D, and 3A-3D. Also, applying the one or more electrically conductive layers on the at least one thin film can comprise applying the one or more electrically conductive layers on the at least one thin film in a configuration that defines the capacitive frequency response is configured to shield, ground, or filter noise or signals carried on the one or more electrically conductive traces, as described in connection with the examples in FIGS. 1, 2A-2D, and 3A-3D.

In some aspects, applying the one or more electrically conductive layers and the at least one thin film can comprise applying the one or more electrically conductive layers and the at least one thin film in a first shape or pattern that at least partially surrounds or encloses an area on the surface or the internal layer that includes at least a portion of the one or more electrically conductive traces, as described in connection with the examples in FIGS. 1, 2A-2D, and 3A-3D. In some aspects, the area on the surface or the internal layer can include at least one electric circuit or component that generates noise or is susceptible to noise, where the first shape or pattern can be configured to shield or connect to a shield component, such that the at least one electric circuit or component is isolated from noise entering or leaving the area, as described in connection with the examples in FIGS. 1, 2A-2D, and 3A-3D.

Additionally, applying the one or more electrically conductive layers and the at least one thin film can comprise applying the one or more electrically conductive layers and the at least one thin film in a first shape or pattern that overlies or matches at least a portion of a second shape or pattern of the one or more electrically conductive traces, as described in connection with the examples in FIGS. 1, 2A-2D, and 3A-3D. In some aspects, the one or more electrically conductive traces can include at least one signal, where the first shape or pattern can be configured to filter or capacitively shunt at least a portion of the at least one signal, as described in connection with the examples in FIGS. 1, 2A-2D, and 3A-3D. Applying the at least one film can also comprise applying a thickness of the at least one thin film based on a geometry or thickness of the one or more electrically conductive traces, as described in connection with any of the examples in FIGS. 1, 2A-2D, and 3A-3D.

In some instances, applying at least one of the at least one thin film or the one or more electrically conductive layers on the surface or the internal layer can comprise depositing at least one of the at least one thin film or the one or more electrically conductive layers on the surface or the internal layer using a vacuum deposition process, as described in connection with the examples in FIGS. 1, 2A-2D, and 3A-3D. Moreover, applying the at least one thin film on the surface or the internal layer can comprise applying the at least one thin film on at least one epoxy material, as described in connection with the examples in FIGS. 1, 2A-2D, and 3A-3D. In some aspects, applying the at least one thin film further can comprise applying at least one of an adhesive layer or a dielectric layer, as described in connection with the examples in FIGS. 1, 2A-2D, and 3A-3D. In addition, applying the one or more electrically conductive layers can comprise applying at least one of a conductive foam, an elastomer, or a metallic foil, as described in connection with the examples in FIGS. 1, 2A-2D, and 3A-3D.

The subject matter described herein can be implemented to realize one or more benefits or advantages. For instance, aspects of the present disclosure can shield or block certain components from noise or signals produced by other components. The described techniques can also provide grounding capabilities to PCB devices that would not otherwise be available. Additionally, aspects of the present disclosure can filter noise or signals from certain components. As such, implementations herein can be configured to shield, ground, and/or filter noise or undesired signals from certain components, e.g., that may be carried on electrically conductive traces. Also, aspects of the present disclosure may not require any other mechanical shielding devices. Further, aspects of the present disclosure may result in more efficient and easy to apply shielding and grounding applications. Aspects of the present disclosure can conserve time, effort, and costs by utilizing the aforementioned features of a PCB device.

Although various aspects are described herein, many variations and permutations of these aspects fall within the scope of this disclosure. Although some potential benefits and advantages of aspects of this disclosure are mentioned, the scope of this disclosure is not intended to be limited to particular benefits, uses, or objectives. Rather, aspects of this disclosure are intended to be broadly applicable to different removable storage technologies, some of which are illustrated by way of example in the figures and in the following description. The detailed description and drawings are merely illustrative of this disclosure rather than limiting, the scope of this disclosure being defined by the appended claims and equivalents thereof.

Several aspects are presented with reference to various apparatus and methods. These apparatus and methods are described in the following detailed description and illustrated in the accompanying drawings by various blocks, components, circuits, processes, algorithms, and the like, which can collectively be referred to as "elements."

Throughout this disclosure, the preferred embodiment and examples illustrated should be considered as exemplars, rather than as limitations on the present disclosure. As used herein, the term "invention," "device," "apparatus," "method," "disclosure," "present invention," "present device," "present apparatus," "present method," or "present disclosure" refers to any one of the embodiments of the disclosure described herein, and any equivalents. Furthermore, reference to various feature(s) of the "invention," "device," "apparatus," "method," "present invention," "present device," "present apparatus," or "present method" throughout this document does not mean that all claimed embodiments or methods must include the referenced feature(s).

When an element or feature is referred to as being "on" or "adjacent" to another element or feature, it can be directly on or adjacent the other element or feature or intervening elements or features may also be present. In contrast, when an element is referred to as being "directly on" or extending "directly onto" another element, there are no intervening elements present. Additionally, when an element is referred to as being "connected" or "coupled to" another element, it can be directly connected or coupled to the other element or intervening elements may be present. In contrast, when an element is referred to as being "directly connected" or "directly coupled" to another element, there are no intervening elements present.

Additionally, relative terms such as "inner," "outer," "upper," "top," "above," "lower," "bottom," "beneath," "below," and similar terms, may be used herein to describe a relationship of one element to another. Terms such as "higher," "lower," "wider," "narrower," and similar terms, may be used herein to describe angular relationships. These terms are intended to encompass different orientations of the elements or system in addition to the orientation depicted in the figures.

Although the terms first, second, third, etc., may be used herein to describe various elements, components, regions, and/or sections, these elements, components, regions, and/or sections should not be limited by these terms. These terms are only used to distinguish one element, component, region, or section from another. Thus, unless expressly stated otherwise, a first element, component, region, or section discussed below could be termed a second element, component, region, or section without departing from the teachings of the present disclosure. As used herein, the term "and/or" includes any and all combinations of one or more of the associated list items.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. For example, when the present specification refers to "an assembly," this language encompasses a single assembly or a plurality or array of assemblies. Further, the terms "comprises," "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present or problems be solved.

The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology. Rather, the scope of the disclosed technology includes what is covered by the following claims. We therefore claim all that comes within the scope and spirit of the claims.

In accordance with this disclosure, the term "or" may be interpreted as "and/or" where context does not dictate otherwise. Additionally, while phrases such as "one or more" or "at least one" or the like may have been used for some features disclosed herein but not others; the features for which such language was not used may be interpreted to have such a meaning implied where context does not dictate otherwise.

Various examples have been described. These and other examples are within the scope of the following claims.

What is claimed is:

1. A printed circuit board (PCB) device, comprising:
a surface or internal layer including one or more electrically conductive traces configured to carry a signal or power plane;
at least one thin film comprising an electrically insulating material disposed on the surface or the internal layer; and
one or more electrically conductive layers on the at least one thin film;
wherein the one or more electrically conductive layers and the one or more electrically conductive traces are separated by the at least one thin film in a configuration that defines a capacitive frequency response between the one or more electrically conductive layers and the one or more electrically conductive traces;
wherein the capacitive frequency response is configured to shield, ground, or filter noise or signals carried on the one or more electrically conductive traces.

2. The device of claim 1, wherein the capacitive frequency response is adjustable based on at least one of a thickness of the at least one thin film or a pattern of the one or more electrically conductive layers.

3. The device of claim 1, wherein the one or more electrically conductive layers and the at least one thin film have a first shape or pattern that at least partially surrounds or encloses an area on the surface or the internal layer that includes at least a portion of the one or more electrically conductive traces.

4. The device of claim 3, wherein the area on the surface or the internal layer includes at least one electric circuit or component that generates noise or is susceptible to noise, wherein the first shape or pattern is configured to shield or connect to a shield component, such that the at least one electric circuit or component is isolated from noise entering or leaving the area.

5. The device of claim 1, wherein the one or more electrically conductive layers and the at least one thin film have a first shape or pattern that overlies or matches at least a portion of a second shape or pattern of the one or more electrically conductive traces.

6. The device of claim 5, wherein the one or more electrically conductive traces include at least one signal, wherein the first shape or pattern is configured to filter or capacitively shunt at least a portion of the at least one signal.

7. The device of claim 1, wherein a thickness of the at least one thin film is based on a geometry of the one or more electrically conductive traces.

8. The device of claim 1, wherein at least one of the at least one thin film or the one or more electrically conductive layers is deposited on the surface or the internal layer using a vacuum deposition process.

9. The device of claim 1, wherein the surface or the internal layer comprise at least one epoxy material.

10. The device of claim 1, wherein the at least one thin film comprises at least one of an adhesive layer or a dielectric layer.

11. The device of claim 1, wherein the one or more electrically conductive layers comprise at least one of a conductive foam, an elastomer, or a metallic foil.

12. A method of fabricating a printed circuit board (PCB) device, comprising:
applying at least one thin film comprising an electrically insulating material on a surface or internal layer, wherein the surface or the internal layer includes one or more electrically conductive traces defining a signal or power plane; and
applying one or more electrically conductive layers on the at least one thin film in a configuration that defines a capacitive frequency response between the one or more electrically conductive layers and the electrically one or more conductive traces, wherein the one or more electrically conductive layers and the one or more electrically conductive traces are separated by the at least one thin film;
wherein the capacitive frequency response is configured to shield, ground, or filter noise or signals carried on the one or more electrically conductive traces.

13. The method of claim 12, wherein applying the at least one thin film comprises applying a thickness of the at least one thin film or a pattern of the one or more electrically conductive layers configured to achieve one of a plurality of values of the capacitive frequency response.

14. The method of claim 12, wherein applying the one or more electrically conductive layers and the at least one thin film comprises applying the one or more electrically conductive layers and the at least one thin film in a first shape or pattern that at least partially surrounds or encloses an area on the surface or the internal layer that includes at least a portion of the one or more electrically conductive traces, wherein the area on the surface or the internal layer includes at least one electric circuit or component that generates noise or is susceptible to noise, wherein the first shape or pattern is configured to shield or connect to a shield component, such that the at least one electric circuit or component is isolated from noise entering or leaving the area.

15. The method of claim 12, wherein applying the one or more electrically conductive layers and the at least one thin film comprises applying the one or more electrically conductive layers and the at least one thin film in a first shape or pattern that overlies or matches at least a portion of a second shape or pattern of the one or more electrically conductive traces, wherein the one or more electrically conductive traces include at least one signal, wherein the first shape or pattern is configured to filter or capacitively shunt at least a portion of the at least one signal.

16. The method of claim 12, wherein applying the at least one film comprises applying a thickness of the at least one thin film based on a geometry of the one or more electrically conductive traces.

17. The method of claim 12, wherein applying at least one of the at least one thin film or the one or more electrically conductive layers on the surface or the internal layer comprises depositing at least one of the at least one thin film or the one or more electrically conductive layers on the surface or the internal layer using a vacuum deposition process.

18. The method of claim 12, wherein applying the at least one thin film on the surface or the internal layer comprises applying the at least one thin film on at least one epoxy material.

* * * * *